(12) United States Patent
Sun et al.

(10) Patent No.: US 11,183,395 B2
(45) Date of Patent: Nov. 23, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Linlin Sun, Shanghai (CN); Bo Su, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 29 days.

(21) Appl. No.: 16/855,059

(22) Filed: Apr. 22, 2020

(65) Prior Publication Data
US 2020/0343100 A1   Oct. 29, 2020

(30) Foreign Application Priority Data
Apr. 23, 2019   (CN) .......................... 201910330725.X

(51) Int. Cl.
*H01L 21/311* (2006.01)

(52) U.S. Cl.
CPC .............................. *H01L 21/31144* (2013.01)

(58) Field of Classification Search
CPC .............................. H01L 23/528; H01L 21/311
See application file for complete search history.

(56) References Cited

U.S. PATENT DOCUMENTS

| | | | |
|---|---|---|---|
| 2018/0358459 A1* | 12/2018 | Anderson | H01L 27/0886 |
| 2020/0135545 A1* | 4/2020 | Srivastava | H01L 21/0228 |
| 2020/0185268 A1* | 6/2020 | Shih | H01L 21/76808 |

* cited by examiner

*Primary Examiner* — Zandra V Smith
*Assistant Examiner* — Andre C Stevenson
(74) *Attorney, Agent, or Firm* — Anova Law Group, PLLC

(57) ABSTRACT

A semiconductor device and its fabrication method are provided. The method includes forming a core layer on a first region of a base substrate layer; forming sidewall spacer layers on sidewalls of two sides of the core layer along a first direction; forming a filling layer on a second region between adjacent sidewall spacer layers which are arranged along the first direction; forming a first dividing trench in the filling layer on the second region to divide the filling layer along a second direction, where sidewalls of the first dividing trench, arranged along the first direction, expose corresponding sidewall spacer layers; forming a second dividing trench in the core layer to divide the core layer along the second direction; forming a second dividing layer in the second dividing trench when forming a first dividing layer in the first dividing trench; and removing the filling layer and the core layer.

14 Claims, 14 Drawing Sheets

SEMICONDUCTOR DEVICE AND FABRICATION METHOD THEREOF

CROSS-REFERENCE TO RELATED APPLICATION

This application claims the priority of Chinese Patent Application No. 201910330725.X, filed on Apr. 23, 2019, the content of which is incorporated herein by reference in its entirety.

TECHNICAL FIELD

The present disclosure generally relates to the field of semiconductor manufacturing and, more particularly, relates to a semiconductor device and its fabrication method.

BACKGROUND

In the semiconductor device manufacturing process, a pattern on a mask may be transferred to a substrate using a photolithographic process. The photolithographic process may include providing the substrate; forming a photoresist on the substrate; exposing and developing the photoresist to form a patterned photoresist, such that the pattern on the mask is transferred to the photoresist; etching the substrate using the patterned photoresist as the mask, such that the pattern on the photoresist is transferred to the substrate; and removing the photoresist.

With the continuous reduction of the semiconductor device size, the critical dimension of photolithography may gradually approach or even exceed the physical limit of photolithography, which may pose a serious challenge to photolithography. The basic concept of a double patterning technique is to form a final target pattern by the double patterning, which may overcome the photolithographic limit for a single patterning technique. However, the existing patterning technology may be relatively complicated.

SUMMARY

One aspect of the present disclosure provides a method for fabricating a semiconductor device. The method includes providing a base substrate layer including first regions and second regions, where the first regions and the second regions are alternatingly arranged along a first direction, and a first region and a second region are adjacent to each other; forming a core layer on the first region of the base substrate layer; forming sidewall spacer layers on sidewalls of two sides of the core layer along the first direction; forming a filling layer on the second region between adjacent sidewall spacer layers which are arranged along the first direction; forming a first dividing trench in the filling layer on the second region to divide the filling layer along a second direction, where the second direction is perpendicular to the first direction, and sidewalls of the first dividing trench, arranged along the first direction, expose corresponding sidewall spacer layers; after forming the filling layer, forming a second dividing trench in the core layer to divide the core layer along the second direction, where sidewalls of the second dividing trench, arranged along the first direction, expose corresponding sidewall spacer layers, and for adjacent first and second regions, a distance, along the second direction, between the second dividing trench on the first region and the first dividing trench on the second region is greater than zero; forming a first dividing layer in the first dividing trench, and forming a second dividing layer in the second dividing trench when forming the first dividing layer; and after forming the first dividing layer and the second dividing layer, removing the filling layer and the core layer.

Another aspect of the present disclosure includes a semiconductor device fabricated by embodiments of the present disclosure. The semiconductor device includes a base substrate layer, including first regions and second regions, where the first regions and the second regions are alternatingly arranged along a first direction, and a first region and a second region are adjacent to each other; a core layer on the first region of the base substrate layer; sidewall spacer layers on sidewalls of two sides of the core layer along the first direction; a filling layer on the second region between adjacent sidewall spacer layers which are arranged along the first direction; a first dividing trench in the filling layer on the second region to divide the filling layer along a second direction, where the second direction is perpendicular to the first direction, and sidewalls of the first dividing trench, arranged along the first direction, expose corresponding sidewall spacer layers; a second dividing trench in the core layer to divide the core layer along the second direction, where sidewalls of the second dividing trench, arranged along the first direction, expose corresponding sidewall spacer layers, and for adjacent first and second regions, a distance, along the second direction, between the second dividing trench on the first region and the first dividing trench on the second region is greater than zero; and a first dividing layer in the first dividing trench, and a second dividing layer in the second dividing trench.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
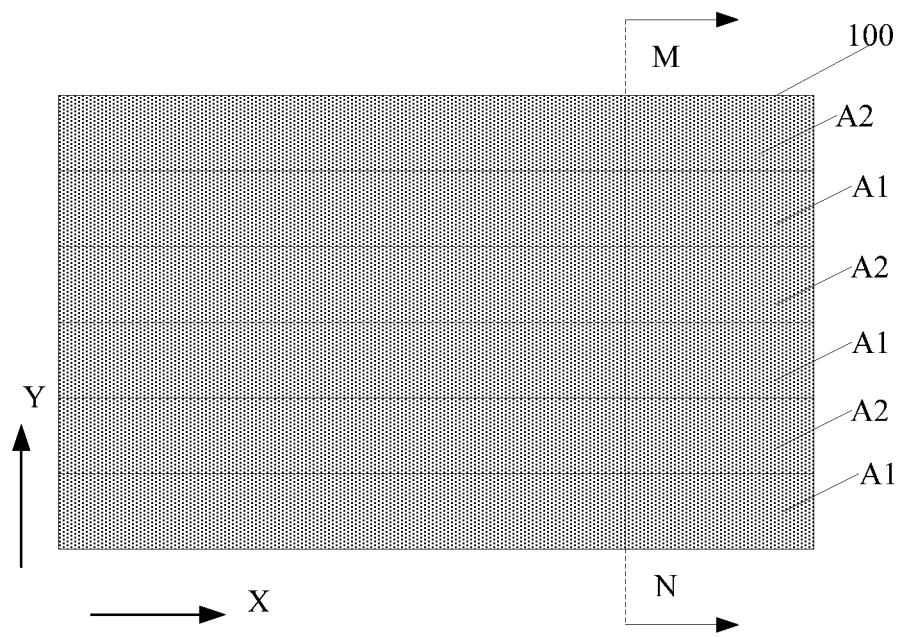
FIGS. 1-24 illustrate structural schematics corresponding to certain stages for forming an exemplary semiconductor device according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

A method for forming a semiconductor device may include providing a base substrate layer including a plurality of discrete first regions and a plurality of discrete second regions, where the first regions and the second regions may be alternatively arranged along a first direction, and a first region and a second region may be adjacent to each other; forming a discrete core layer on the first region of the base substrate layer; forming discrete sidewall spacer layers on sidewalls of two sides of the core layer along the first direction; forming a filling layer on the second region of between adjacent sidewall spacer layers which are arranged along the first direction; forming a first dividing trench in the filling layer, where the first dividing trench may divide the filling layer along the second direction, the second direction may be perpendicular to the first direction, and sidewalls of the first dividing trench, arranged along the first direction, may expose corresponding sidewall spacer layers; forming a first dividing layer in the first dividing trench; after forming the first dividing layer, forming a second dividing trench in the core layer, where the second dividing trench may divide the core layer along the second direction, sidewalls of the second dividing trench, arranged along the first direction, may expose corresponding sidewall spacer layers, and for adjacent first and second regions, a distance, along the second direction, between the second dividing trench on the first region and the first dividing trench on the second region may be greater than zero; forming a second dividing layer in the second dividing trench; and after forming the second dividing layer, removing the filling layer and the core layer.

In the above-mentioned method, the first dividing layer and the second dividing layer may be successively formed in different steps, so two sets of fabrication processes may be required to form the first dividing layer and the second dividing layer respectively. For example, the process for forming the first dividing layer may include: forming a first dividing film in the first dividing trench, on the core layer, the sidewall spacer layer and the filling layer; and planarizing the first dividing film till exposing top surfaces of the core layer, the sidewall spacer layer and the filling layer. For example, the process for forming the second dividing layer may include: forming a second dividing film in the second dividing trench, on the core layer, the sidewall spacer layer and the filling layer; and planarizing the second dividing film till exposing top surfaces of the core layer, the sidewall spacer layer and the filling layer.

It can be seen that the above-mentioned processes may require two deposition and two planarization processes, which makes the formation processes of the first dividing layer and the second dividing layer more complicated, resulting in complicated processing steps of the semiconductor device.

The present disclosure provides a method for forming the semiconductor device. The discrete core layer is formed on the first region of the base substrate layer. The discrete sidewall spacer layers are formed on sidewalls of two sides of the core layer along the first direction. The filling layer is formed on the second region between adjacent sidewall spacer layers which are arranged along the first direction. The first dividing trench is formed in the filling layer, where the first dividing trench may divide the filling layer along the second direction, and sidewalls of the first dividing trench, arranged along the first direction, may expose corresponding sidewall spacer layers. Next, the second dividing trench in the core layer is formed, where the second dividing trench may divide the core layer along the second direction, sidewalls of the second dividing trench, arranged along the first direction, may expose corresponding sidewall spacer layers, and for adjacent first and second regions, a distance, along the second direction, between the second dividing trench on the first region and the first dividing trench on the second region may be greater than zero. The second dividing layer is formed in the second dividing trench when forming the first dividing layer in the first dividing trench, and the filling layer and the core layer are removed subsequently. In such way, the processing steps of the method may be simplified.

In order to further illustrate the above described objects, features, and advantages of the present disclosure, various specific embodiments of the present disclosure will be described in detail below with reference to the accompanying drawings.

FIGS. 1-24 illustrate structural schematics corresponding to certain stages for forming an exemplary semiconductor device according to various disclosed embodiments of the present disclosure. FIG. 25 illustrates a flowchart of an exemplary fabrication method for forming a semiconductor structure according to various disclosed embodiments of the present disclosure.

Figure 2:

Referring to FIG. 1 and FIG. 2, FIG. 2 is a cross-sectional view along a cross-sectional line M-N in FIG. 1. A base substrate layer 100 may be provided, where the base substrate layer 100 may include a plurality of first regions A1 and a plurality of second regions A2 (e.g., in S401 of FIG. 25). The first regions A1 and the second regions A2 may be alternatively arranged along a first direction Y, and a first region A1 and a second region A2 may be adjacent to each other.

In one embodiment, the base substrate layer 100 may include a layer to be etched 101 and a hard mask layer 102 on the layer to be etched 101.

The layer to be etched 101 may be made of a material including silicon oxide or a low-k dielectric layer material (k is equal to or less than 3.9). The hard mask layer 102 may be made of a material including titanium nitride.

In one embodiment, the method further includes: before forming the hard mask layer 102, forming a first etch stop layer (not shown) on a surface of the layer to be etched 101, where the hard mask layer 102 may be on a surface of the first etch stop layer; and forming a second etch stop layer on the hard mask layer 102.

The first etch stop layer may be made of a material including silicon oxide, and the second etch stop layer may be made of a material including silicon oxide.

The function of the hard mask layer 102 may include the following. The hard mask layer 102 may be used as the etch stop layer; the hard mask layer 102 may be used as a stop layer for planarizing a conductive film subsequently; and the material of the hard mask layer 102 may be used as a hard mask material. Therefore, when forming a first target trench and a second target trench by a subsequent etching process, the etching loss of the hard mask layer 102 may be small, and the stability of pattern transfer may be high during the process of transferring the pattern in the hard mask layer 102 to the layer to be etched 101.

In other embodiments, the hard mask layer, the first etch stop layer, and the second etch stop layer may not be formed.

Figure 3:
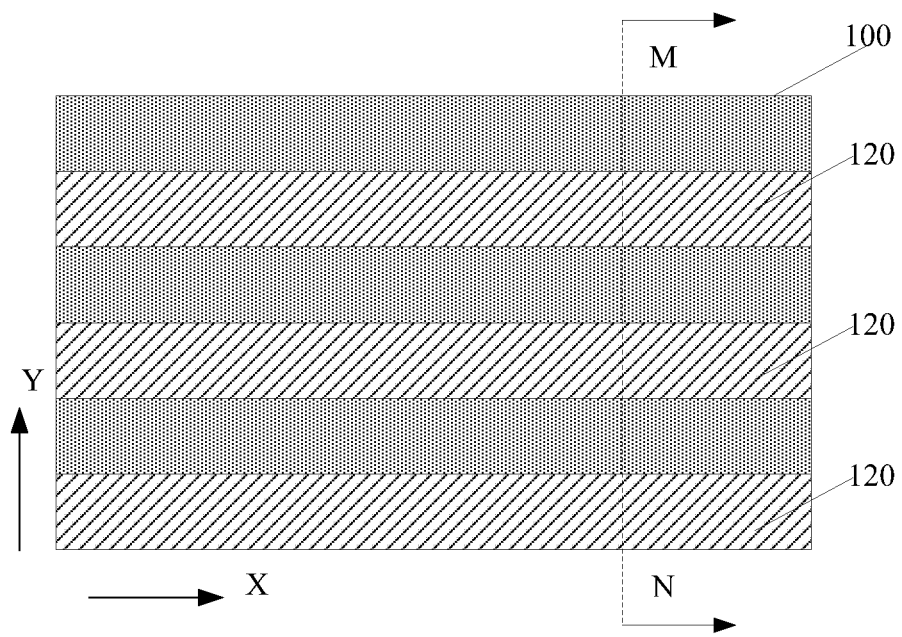
Figure 4:
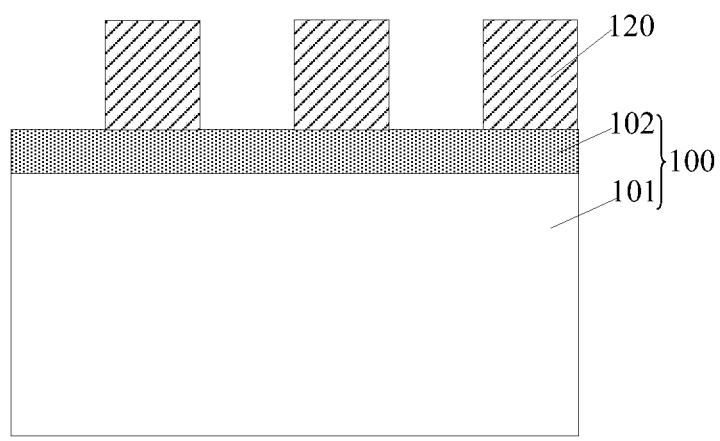

Referring to FIG. 3 and FIG. 4, FIG. 3 is a schematic for the structure based on FIG. 1, FIG. 4 is a schematic for the structure based on FIG. 2, and FIG. 4 is a cross-sectional view along a cross-sectional line M-N in FIG. 3. A discrete core layer 120 may be formed on the first region A1 of the base substrate layer 100 (e.g., in S402 of FIG. 25).

In one embodiment, a discrete core layer 120 may be formed on the second etch stop layer.

In one embodiment, the material of the core layer 120 may be different from the material of the hard mask layer 102.

The core layer 102 may be made of a material including amorphous silicon, silicon nitride or silicon oxide. In one embodiment, the material of the core layer 120 may be amorphous silicon as an example.

An extending direction of the core layer 120 may be in parallel with a second direction X which is perpendicular to a first direction Y.

The method for forming the core layer 120 may include: forming a core film on the first regions A1 and the second regions A2 of the base substrate layer 100; and removing the core film on the second region A2 to form the core layer 120.

Figure 5:
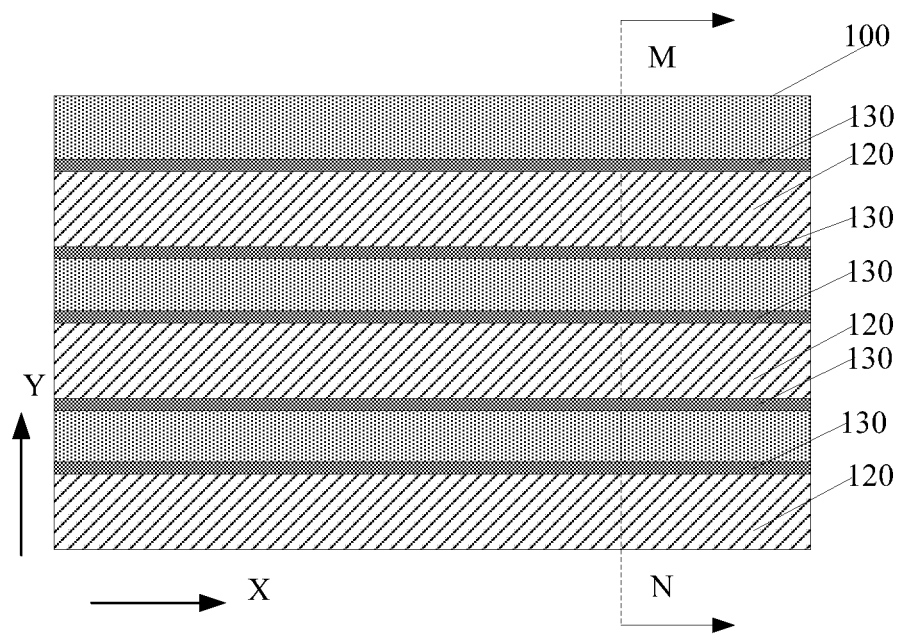
Figure 6:
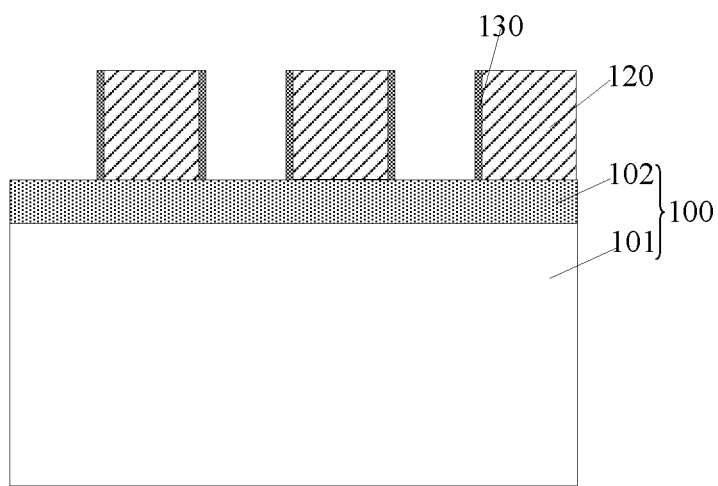

Referring to FIG. 5 and FIG. 6, FIG. 5 is a schematic for the structure based on FIG. 3, FIG. 6 is a schematic for the structure based on FIG. 4, and FIG. 6 is a cross-sectional view along a cross-sectional line M-N in FIG. 5. Discrete sidewall spacer layers 130 may be formed on sidewalls of two sides of the core layer 120 along the first direction Y (e.g., in S403 of FIG. 25).

The method for forming the sidewall spacer layer 130 may include: forming a sidewall spacer film on the surface of the base substrate layer 100 at the side of the core layer 120, and also on the sidewalls and top surface of the core layer 120; and etching back the sidewall spacer film till exposing the surface of the base substrate layer 100 and the top surface of the core layer 120 to form the sidewall spacer layer 130.

The material of the sidewall spacer layer 130 may be different from the material of the core layer 120. In one embodiment, the material of the sidewall spacer layer 130 may be TiO$_2$ as an example.

The sidewall spacer layer 130 may be made of a material including SiO$_2$, SiN, TiO$_2$, TiN, AlN, Al$_2$O$_3$ or a combination thereof.

A thickness of the sidewall spacer layer 130 may be about 10 nm to about 20 nm.

The sidewall spacer layer 130 may be formed by a deposition process, such as an atomic layer deposition process.

In one embodiment, the sidewall spacer layer 130 may be formed by the atomic layer deposition process, such that the quality of the sidewall spacer layer 130 may be relatively high and the thickness uniformity of the sidewall spacer layer 130 may be relatively high.

Figure 7:
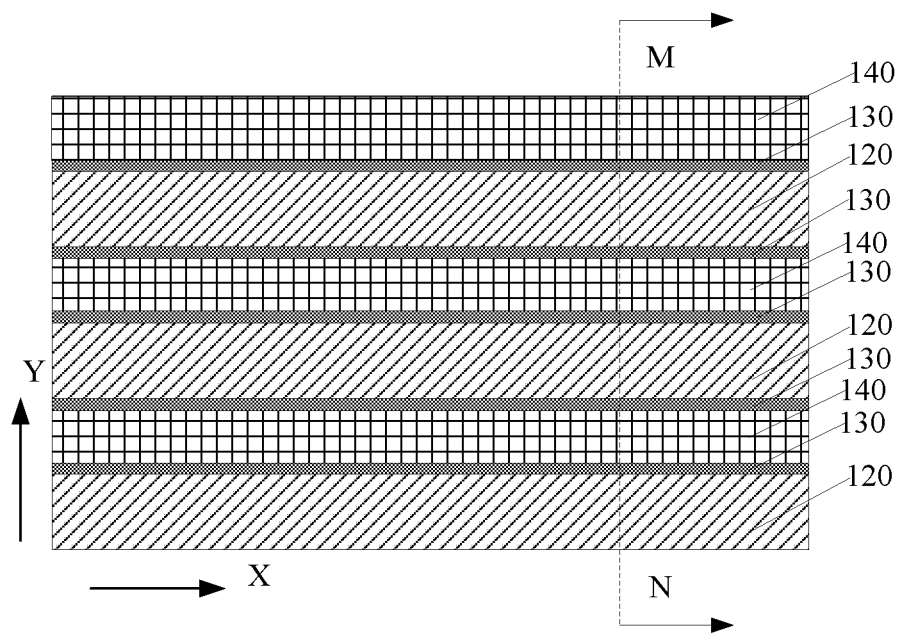
Figure 8:
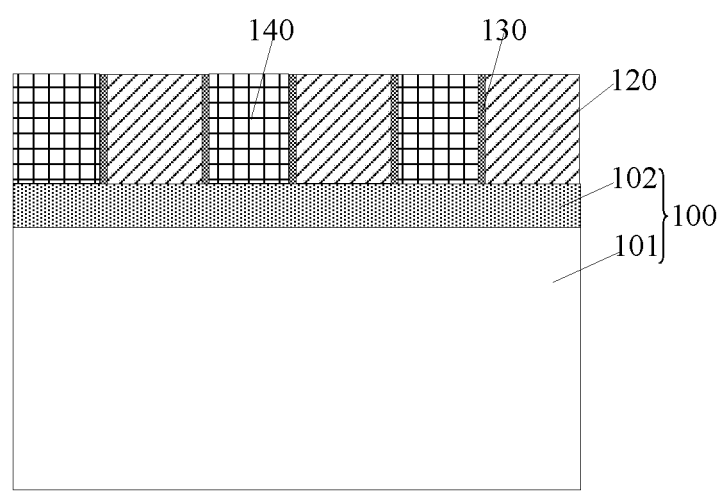

Referring to FIG. 7 and FIG. 8, FIG. 7 is a schematic for the structure based on FIG. 5, FIG. 8 is a schematic for the structure based on FIG. 6, and FIG. 8 is a cross-sectional view along a cross-sectional line M-N in FIG. 7. A filling layer 140 may be formed on the second region A2 between adjacent sidewall spacer layers 130 which are arranged along the first direction Y (e.g., in S404 of FIG. 25).

The filling layer 140 may be made of a material including SiO$_2$, SiN, TiO$_2$, TiN, AlN, Al$_2$O$_3$ or a combination thereof. In one embodiment, the material of the filling layer 140 may be SiO$_2$ as an example.

The materials of the filling layer 140, the core layer 120 and the sidewall spacer layer 130 may be different from each other.

The filling layer 140 may be formed by a deposition layer. The entire top surface of the filling layer 140 may be coplanar with the top surface of the sidewall spacer layer 130 and the top surface of the core layer 120.

The method for forming the filling layer 140 may include: forming a filling film on the second region A2 between adjacent sidewall spacer layers 130 which are arranged along the first direction Y, and on the sidewall spacer layer 130 and the core layer 120; and planarizing the filling film till exposing the top surface of the sidewall spacer layer 130 and the top surface of the core layer 120 to form the filling layer 140.

Next, a first dividing trench may be formed in the filling layer 140, where the first dividing trench may divide the filling layer 140 along the second direction, the second direction X may be perpendicular to the first direction Y, and sidewalls of the first dividing trench, arranged along the first direction Y, may expose corresponding sidewall spacer layers 130.

In one embodiment, the method may further include: before forming the first dividing trench, forming a first blocking layer on the core layer 120, the sidewall spacer layer 130 and the filling layer 140, where the first blocking layer may have a first blocking opening on one or more filling layers 140, and the first blocking opening may also extend along the first direction Y on one or more of the sidewall spacer layers 130 and one or more of the core layers 120 to expose the one or more of the sidewall spacer layers 130 and the one or more of the core layers 120; using the first blocking layer, the core layer 120 and the sidewall spacer layer 130 as a mask, etching and removing the filling layer 140 at a bottom of the first blocking opening and forming the first dividing trench in the filling layer 140; and after forming the first dividing trench and before forming the first dividing layer, removing the first blocking layer.

In one embodiment, the method may further include: before forming a second dividing trench, forming a second blocking layer on the core layer 120, the sidewall spacer layer 130 and the filling layer 140, where the second blocking layer may have a second blocking opening on one or more core layers 120, and the second blocking opening may also extend along the first direction Y on one or more of the sidewall spacer layers 130 and one or more of the filling layers 140 to expose the one or more of the sidewall spacer layers 130 and the one or more of the filling layers 140; using the second blocking layer, the sidewall spacer layer 130 and the filling layer 140 as a mask, etching and removing the core layer 120 at a bottom of the second blocking opening and forming the second dividing trench in the core layer 120; and after forming the second dividing trench and before forming the second dividing layer, removing the second blocking layer.

In one embodiment, the second dividing trench may be formed after forming the first dividing trench, as an example. In other embodiments, the first dividing trench may be formed after forming the second dividing trench.

Figure 9:
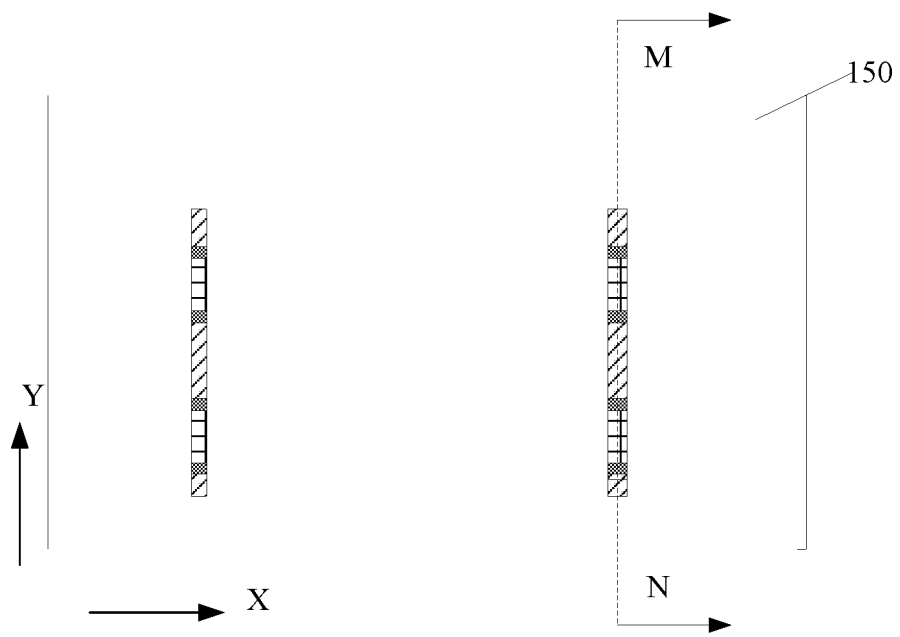
Figure 10:
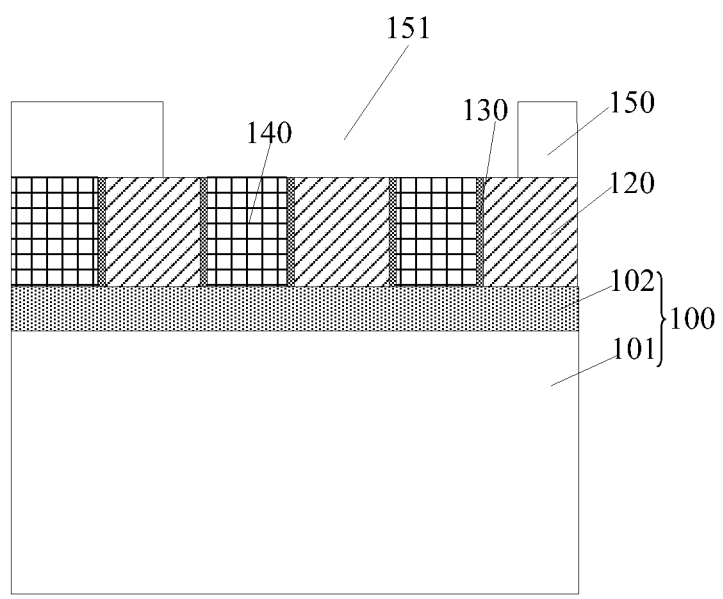

Referring to FIG. 9 and FIG. 10, FIG. 9 is a schematic for the structure based on FIG. 7, FIG. 10 is a schematic for the structure based on FIG. 8, and FIG. 10 is a cross-sectional view along a cross-sectional line M-N in FIG. 9. A first blocking layer 150 may be formed on the core layer 120, the sidewall spacer layer 130 and the filling layer 140. The first blocking layer 150 may have a first blocking opening 151 on one or more filling layers 140. The first blocking opening 151 may also extend along the first direction Y on one or more of the sidewall spacer layers 130 and one or more of the core layers 120 to expose the one or more of the sidewall spacer layers 130 and the one or more of the core layers 120.

The first blocking layer 150 may be made of a material including a carbon-containing organic polymer.

A width of the first blocking opening 151 along the second direction X may be used to define a size of the first dividing layer along the second direction X subsequently. Since the size of the first dividing layer along the second direction X is required to be relatively small, the width of the first blocking opening 151 along the second direction X may be relatively small. For example, in one embodiment, the width of the first blocking opening 151 along the second direction X may be about 20 nm to about 60 nm.

The first blocking opening 151 may also extend along the first direction Y on one or more of the sidewall spacer layers 130 and one or more of the core layers 120 to expose the one or more of the sidewall spacer layers 130 and the one or more of the core layers 120, so the size of the first blocking layer 151 along the first direction Y may be relatively large. In such way, the first blocking opening 151 may only have a small width along the second direction X, and the size of the first blocking opening 151 along the first direction Y may not be limited to be small, which may reduce the challenge to the photolithography process and also reduce the process difficulty. In one embodiment, the size of the first blocking opening 151 along the first direction Y may be about 65 nm to about 1000 nm, for example, 80 nm, 90 nm, 100 nm, 150 nm or 200 nm.

Figure 11:
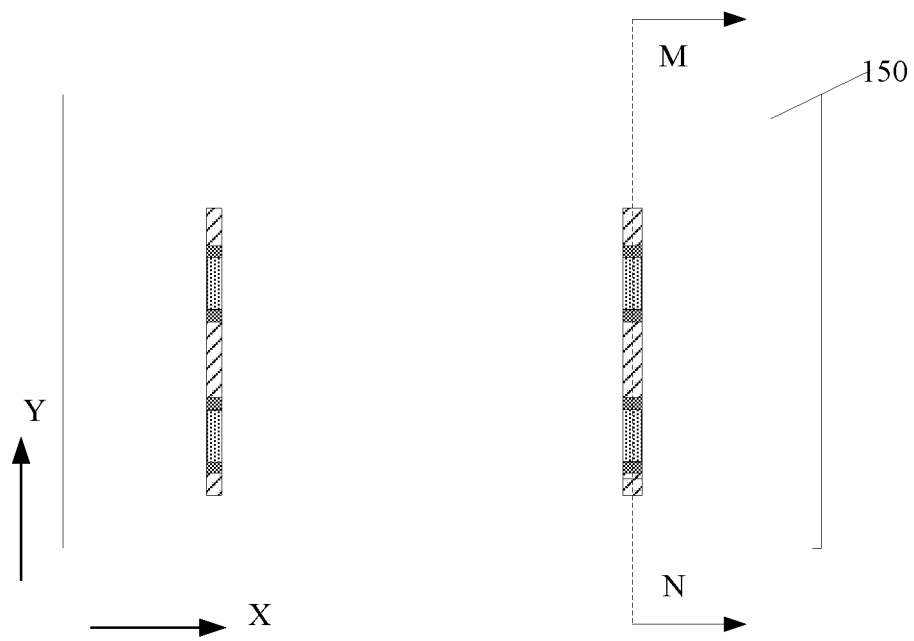
Figure 12:
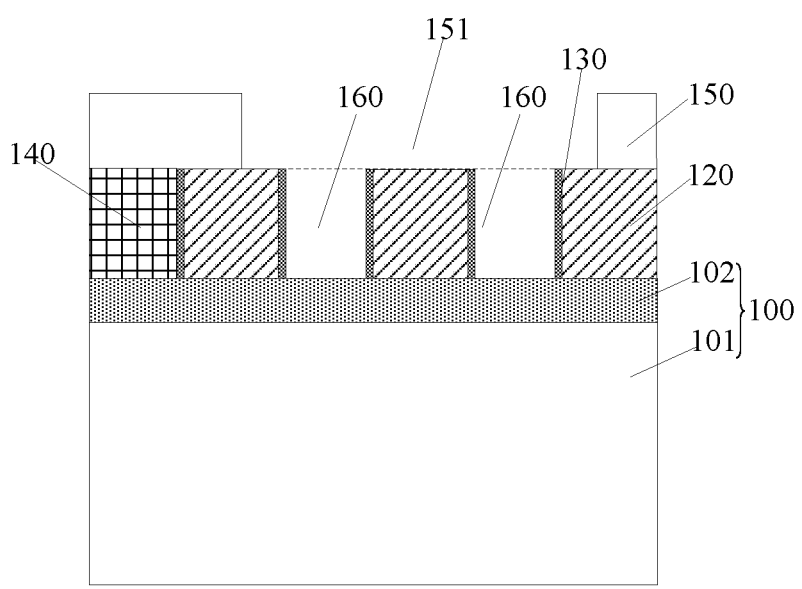

Referring to FIG. 11 and FIG. 12, FIG. 11 is a schematic for the structure based on FIG. 9, FIG. 12 is a schematic for the structure based on FIG. 10, and FIG. 12 is a cross-sectional view along a cross-sectional line M-N in FIG. 11. Using the first blocking layer 150, the core layer 120 and the sidewall spacer layer 130 as a mask, the filling layer 140 at the bottom of the first blocking opening 151 may be removed by an etching process to form a first dividing trench 160 in the filling layer 140 (e.g., in S405 of FIG. 25).

When forming the first dividing trench 160, the etching rate of the filling layer 140 may be greater than the etching rate of the core layer 120 and also greater than the etching rate of the sidewall spacer layer 130. In one embodiment, when forming the first dividing trench 160, a ratio between the etching rate of the filling layer 140 to the etching rate of the core layer 120 may be about 10:1~about 30:1, for example, 20:1. When forming the first dividing trench 160, a ratio between the etching rate of the filling layer 140 to the etching rate of the sidewall spacer layer 130 may be about 10:1~about 30:1, for example, 20:1.

The first dividing trench 160 may divide the filling layer 140 along the second direction X. The second direction X may be perpendicular to the first direction Y. Sidewalls of the first dividing trench 160, arranged along the first direction Y, may expose corresponding sidewall spacer layers 130.

The width of the first blocking opening 151 along the second direction X may be used to define a width of the first dividing trench 160 along the second direction X. The width of the first dividing trench 160 along the second direction X may be about 20 nm to about 60 nm.

Since the size of the filling layer 140 along the first direction Y defines the size of the first dividing trench 160 along the first direction Y, the size of the first dividing trench 160 along the first direction may be relatively small. Since the width of the first blocking opening 151 along the second direction X is used to define the size of the first dividing trench 160 along the second direction X, the size of the first dividing trench 160 along the second direction X may also be relatively small when the width of the first blocking opening 151 along the second direction X is relatively small.

Figure 13:
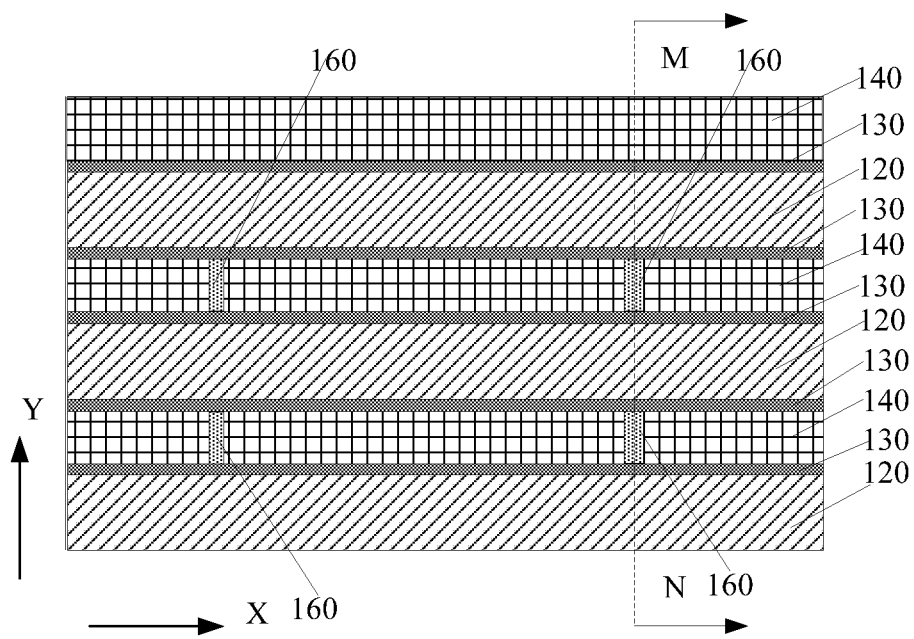
Figure 14:
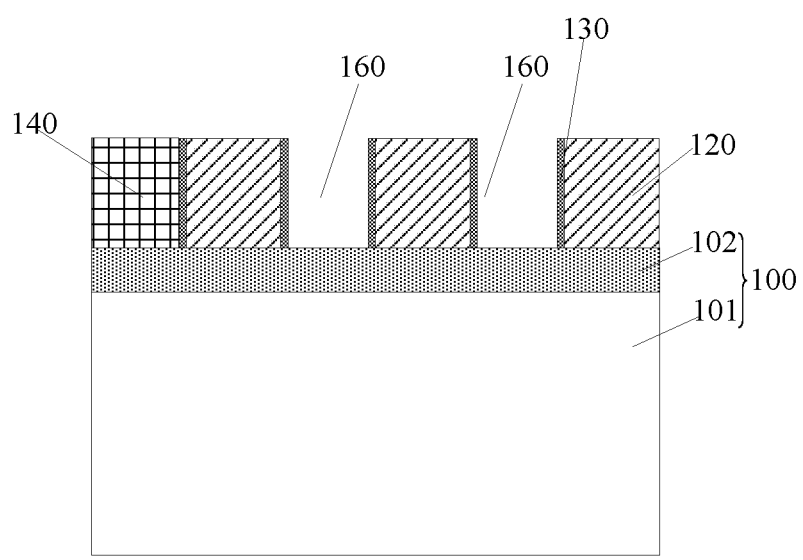

Referring to FIG. 13 and FIG. 14, FIG. 13 is a schematic for the structure based on FIG. 11, FIG. 14 is a schematic for the structure based on FIG. 12, and FIG. 14 is a cross-sectional view along a cross-sectional line M-N in FIG. 13. After forming the first dividing trench 160, the first blocking layer 150 may be removed.

Figure 15:
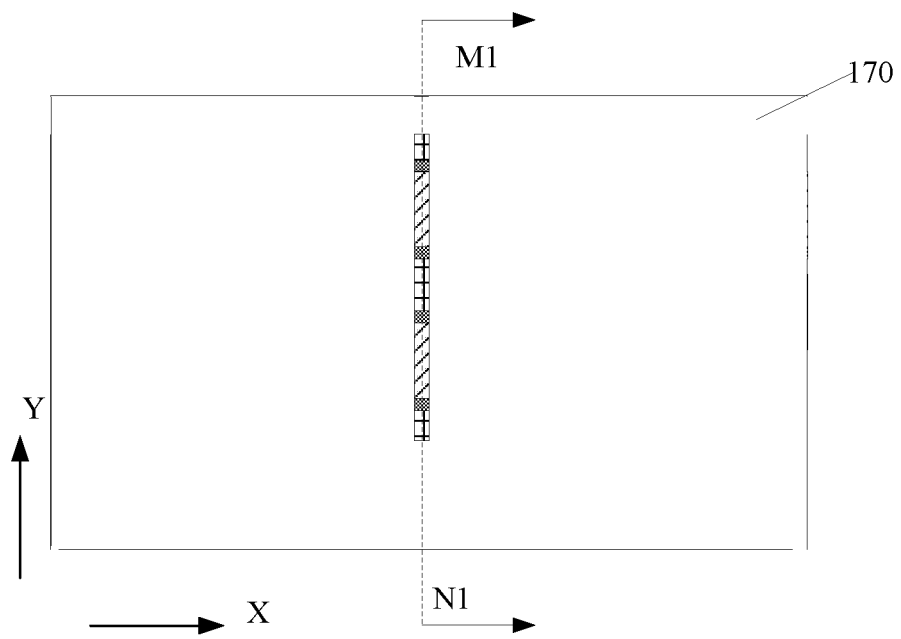
Figure 16:
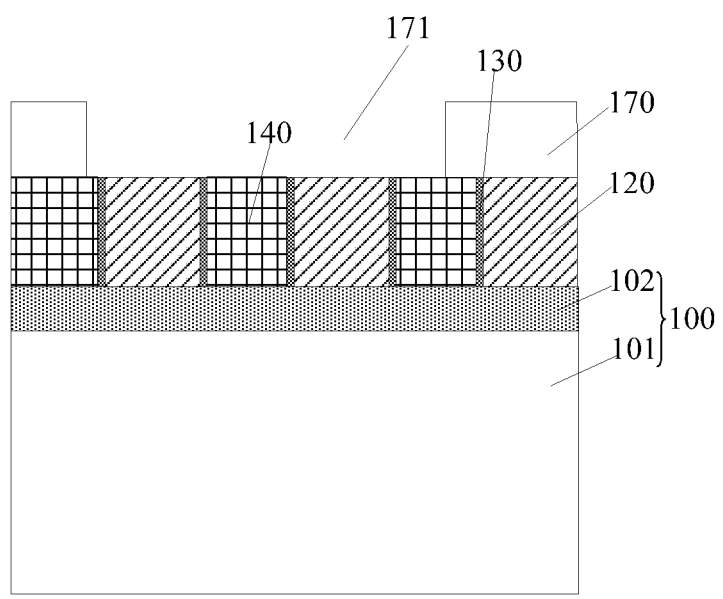

Referring to FIG. 15 and FIG. 16, FIG. 15 is a schematic for the structure based on FIG. 13 and FIG. 16 is a cross-sectional view along a cross-sectional line M-N in FIG. 15. After forming the filling layer 140, a second blocking layer 170 may be formed on the core layer 120, the sidewall spacer layer 130 and the filling layer 140. The second blocking layer 170 may have a second blocking opening 171 on one or more core layers 120, and the second blocking opening 171 may extend along the first direction Y on one or more of the sidewall spacer layers 130 and one or more of the filling layers 140 to expose the one or more of the sidewall spacer layers 130 and the one or more of the filling layers 140.

The second blocking layer 170 may be made of a material including a carbon-containing organic polymer.

In one embodiment, after forming the first blocking layer 150, the second blocking layer 170 may be formed. Accordingly, the second blocking layer 170 may also be filled in the first dividing trench 160.

A width of the second blocking opening 171 along the second direction X may be used to define a size of the second dividing layer along the second direction X subsequently. Since the size of the second dividing layer along the second direction X is required to be relatively small, the width of the second blocking opening 171 along the second direction X may be relatively small. For example, in one embodiment, the width of the second blocking opening 171 along the second direction X may be about 20 nm to about 60 nm.

The second blocking opening 171 may also extend along the first direction Y on one or more of the sidewall spacer layers 130 and one or more of the core layers 120 to expose the one or more of the sidewall spacer layers 130 and the one or more of the core layers 120, so the size of the second blocking layer 171 along the first direction Y may be relatively large. In such way, the second blocking opening 171 may only have a relatively small width along the second direction X, and the size of the second blocking opening 171 along the first direction Y may not be limited to be relatively small, which may reduce the challenge to the photolithography process and also reduce the process difficulty. In one embodiment, the size of the second blocking opening 171 along the first direction Y may be about 65 nm to about 1000 nm, for example, 80 nm, 90 nm, 100 nm, 150 nm or 200 nm.

Figure 17:
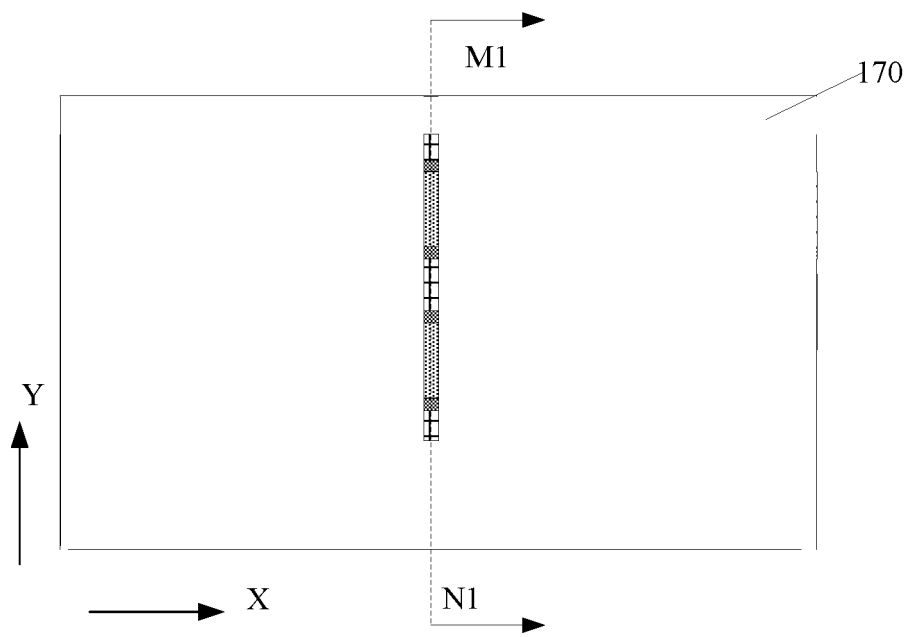
Figure 18:
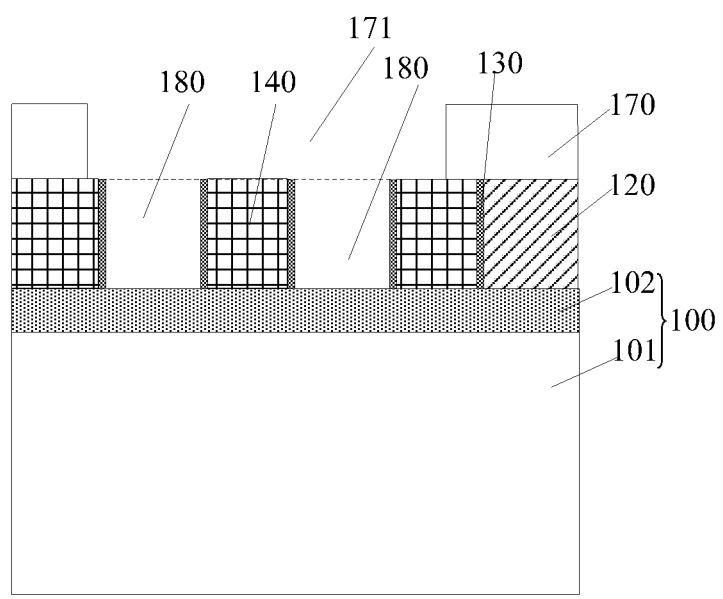

Referring to FIG. 17 and FIG. 18, FIG. 17 is a schematic for the structure based on FIG. 15, FIG. 18 is a schematic for the structure based on FIG. 16, and FIG. 18 is a cross-sectional view along a cross-sectional line M-N in FIG. 17. Using the second blocking layer 170, the sidewall spacer layer 130, and the filling layer 140 as a mask, the core layer 120 at the bottom of the second blocking opening 171 may be removed by an etching process to form a second dividing trench 180 in the core layer 120 (e.g., in S406 of FIG. 25).

When forming the second dividing trench 180, the etching rate of the core layer 120 may be greater than the etching rate of the filling layer 140 and also greater than the etching rate of the sidewall spacer layer 130. In one embodiment, when forming the second dividing trench 180, a ratio between the etching rate of the core layer 120 to the etching rate of the filling layer 140 may be about 10:1~about 30:1, for example, 20:1. When forming the second dividing trench 180, a ratio between the etching rate of the core layer 120 to the etching rate of the sidewall spacer layer 130 may be about 10:1~about 30:1, for example, 20:1.

The second dividing trench 180 may divide the core layer 120 along the second direction X. The second direction X may be perpendicular to the first direction Y. Sidewalls of the second dividing trench 180, arranged along the first direction Y, may expose corresponding sidewall spacer layers 130.

The width of the second blocking opening 171 along the second direction X may be used to define a width of the second dividing trench 180 along the second direction X. The width of the second dividing trench 180 along the second direction X may be about 20 nm to about 60 nm.

Since the size of the core layer 120 along the first direction Y defines the size of the second dividing trench 180 along the first direction Y, the size of the second dividing trench 180 along the first direction may be relatively small. Since the width of the second blocking opening 171 along the second direction X is used to define the size of the second dividing trench 180 along the second direction X, the size of the second dividing trench 180 along the second direction X may also be relatively small when the width of the second blocking opening 171 along the second direction X is relatively small.

The second dividing trench 180 may divide the core layer 120 along the second direction X, sidewalls of the second dividing trench 180, arranged along the first direction Y, may expose corresponding sidewall spacer layers 130. For adjacent first region A1 and second region A2, the distance, along the second direction X, between the second dividing trench 180 on the first region A1 and the first dividing trench 160 on the second region A2 may be greater than zero, that is, the second dividing trench 180 on the first region A1 and the first dividing trench 160 on the second region A2 may not be overlapped.

Figure 19:
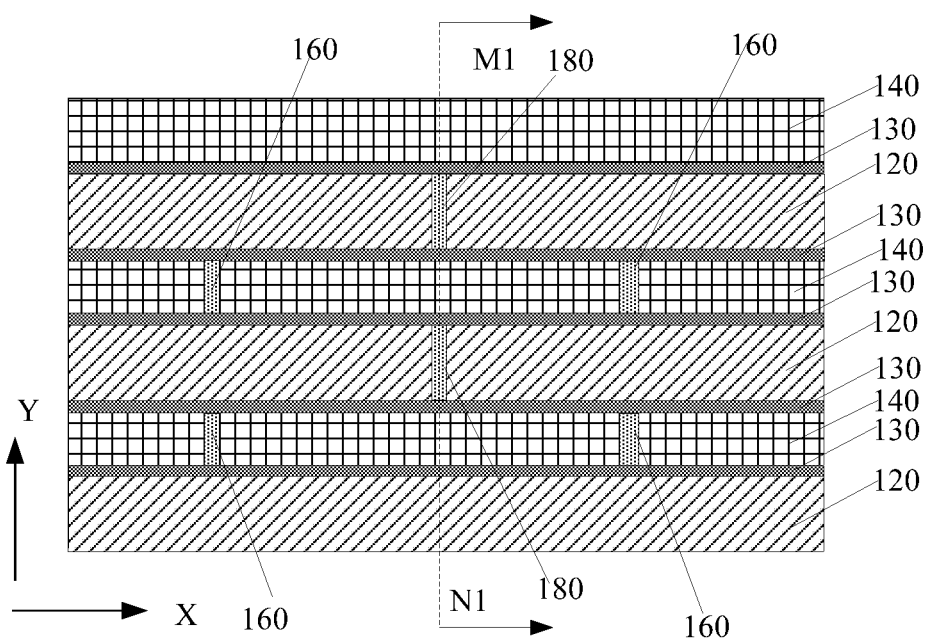
Figure 20:
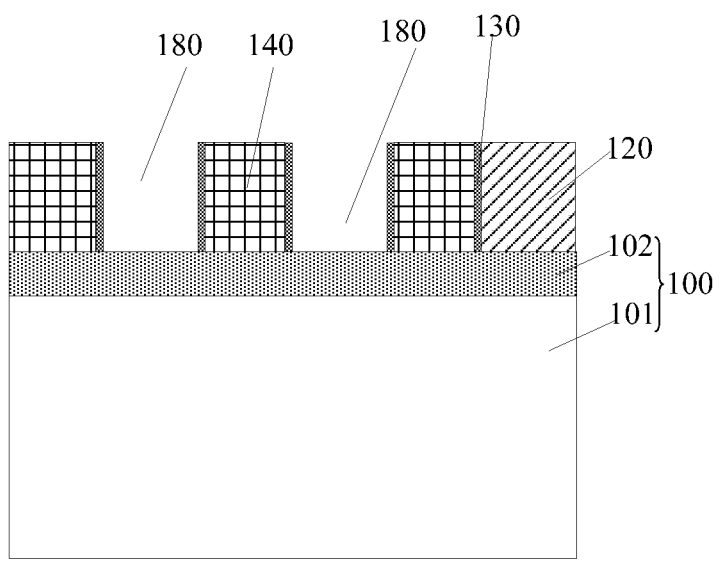

Referring to FIG. 19 and FIG. 20, FIG. 19 is a schematic for the structure based on FIG. 17, FIG. 20 is a schematic for the structure based on FIG. 18, and FIG. 20 is a cross-sectional view along a cross-sectional line M-N in FIG. 19. After forming the second dividing trench 180, the second blocking layer 170 may be removed.

Figure 21:
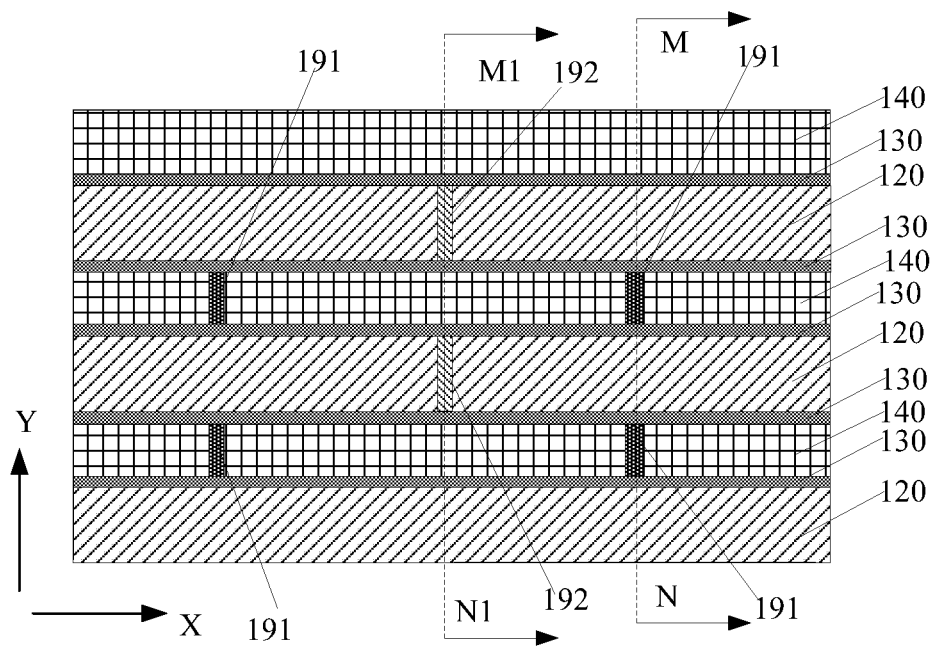
Figure 22:
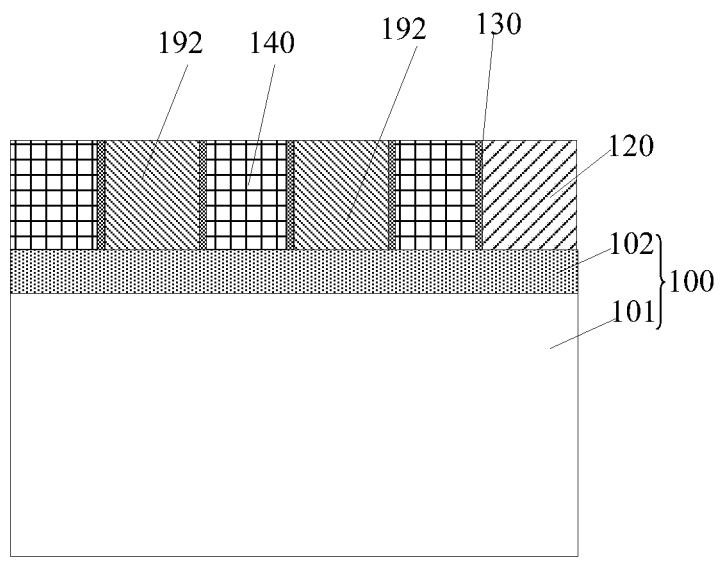
Figure 23:
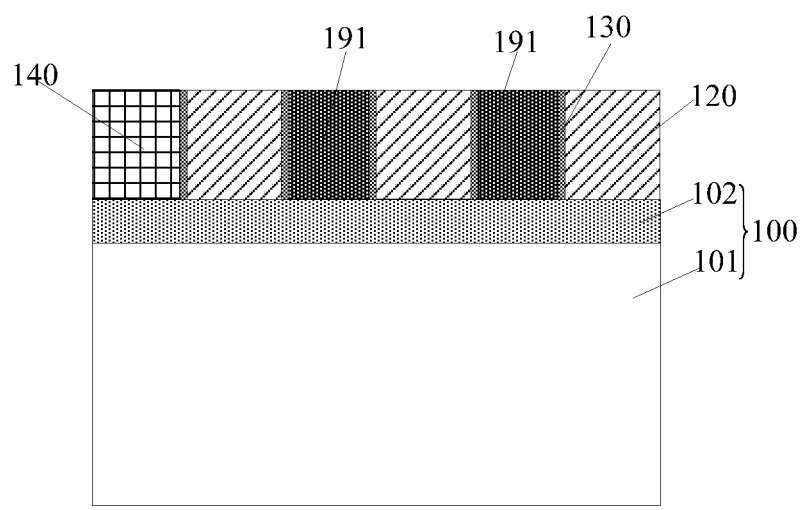

FIG. 21 is a schematic for the structure based on FIG. 19, FIG. 22 is a schematic for the structure based on FIG. 20, FIG. 22 is a cross-sectional view along a cross-sectional line M1-N1 in FIG. 21, and FIG. 23 is a cross-sectional view along a cross-sectional line M-N in FIG. 21. After forming the first dividing trench 160 and the second dividing trench 180, a first dividing layer 191 may be formed in the first dividing trench 160; and when forming the first dividing layer 191, a second dividing layer 192 may be formed in the second dividing trench 180 (e.g., in S407 of FIG. 25).

In one embodiment, after removing the second blocking layer 170, the first dividing layer 191 and the second dividing layer 192 may be formed.

The method for forming the first dividing layer 191 and the second dividing layer 192 may include: forming a dividing film in the first dividing trench 160 and the second dividing trench 180 and on the core layer 120, the filling layer 140 and the sidewall spacer layer 130; and planarizing the dividing film till exposing the top surfaces of the core layer 120, the filling layer 140 and the sidewall spacer layer 130 and forming the first dividing layer 191 and the second dividing layer 192.

The process of planarizing the dividing film till exposing the top surfaces of the core layer 120, the filling layer 140 and the sidewall spacer layer 130 may be a chemical mechanical polishing process.

In one embodiment, the materials of the first dividing layer 191, the second dividing layer 192 and the sidewall spacer layer 130 may be same. In such way, it may have the following advantage: when transferring the pattern to the hard mask layer using the first dividing layer 191, the second dividing layer 192 and the sidewall spacer layer 130 as a mask subsequently, only the etching selectivity between such two materials including the sidewall spacer layer and the hard mask layer may be considered, which may have a low etching process requirement.

In another embodiment, the materials of the first dividing layer 191 and the second dividing layer 192 may be same, and the material of the first dividing layer 191 may be different from the material of each of the sidewall spacer layer 130, the filling layer 140 and the core layer 120.

The size of the first dividing layer 191 along the second direction X may be about 20 nm to about 60 nm; and the size of the second dividing layer 192 along the second direction X may be about 20 nm to about 60 nm.

Figure 24:
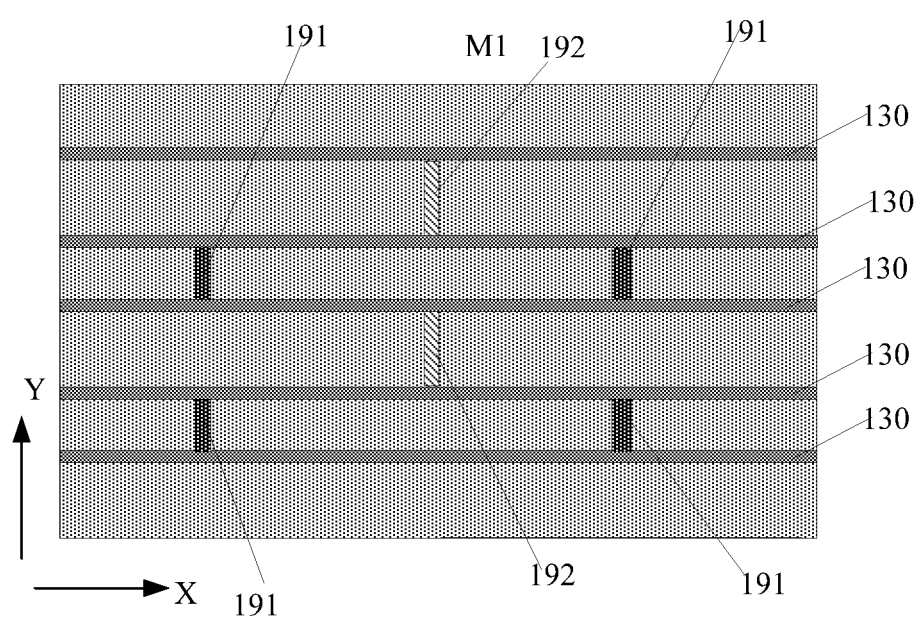
Figure 25:
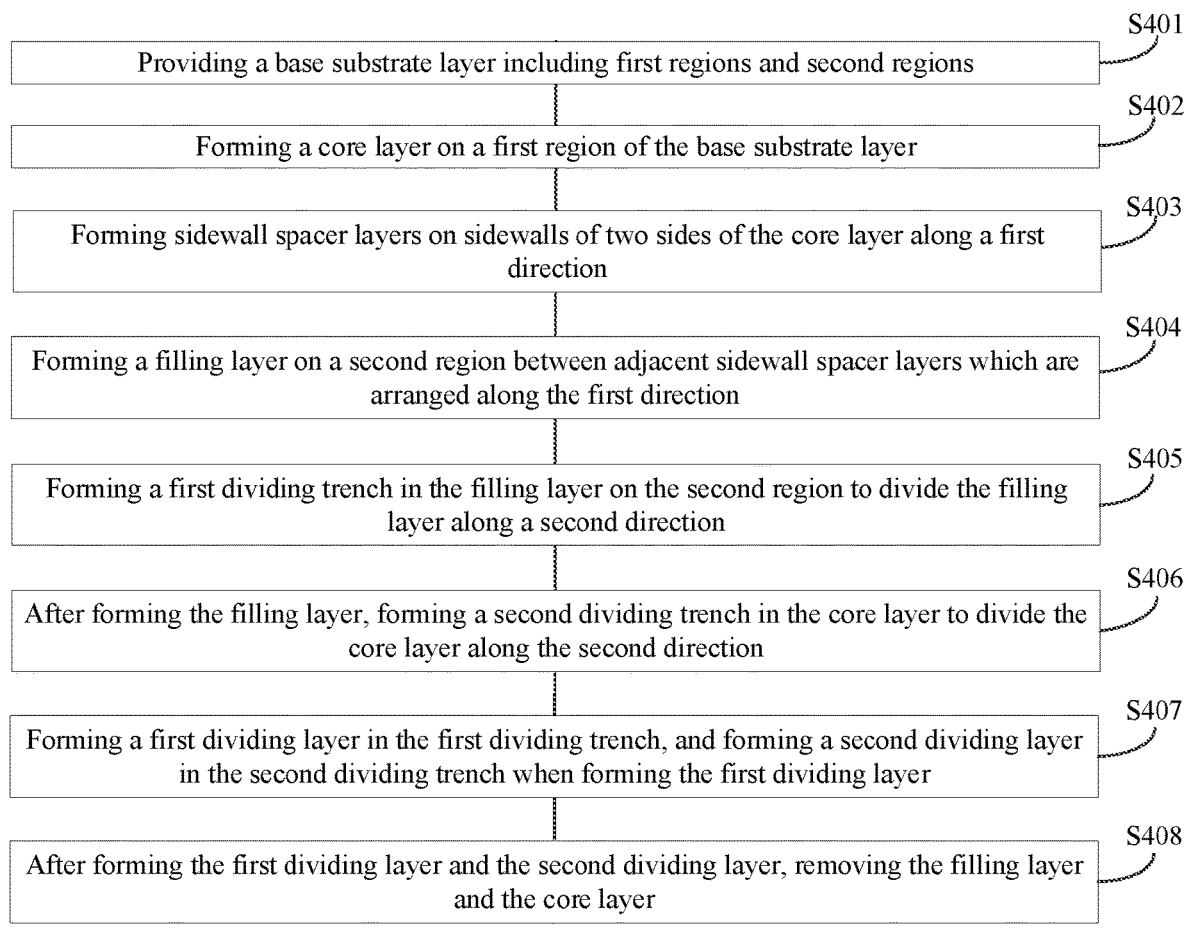
FIG. 25 illustrates a flowchart of an exemplary fabrication method for forming a semiconductor structure according to various disclosed embodiments of the present disclosure.

Referring to FIG. 24, FIG. 24 is a schematic for the structure based on FIG. 21. After forming the first dividing layer 191 and the second dividing layer 192, the filling layer 140 and the core layer 120 may be removed (e.g., in S408 of FIG. 25).

After forming the first dividing layer and the second dividing layer, the first trench may be formed on the second region of the base substrate layer by removing the filling layer, and the second trench may be formed on the first region of the base substrate layer by removing the core layer. The first dividing layer may divide the first trench along the second direction, and sidewalls of the first trench, arranged along the first direction, may expose corresponding sidewall spacer layers. The second dividing layer may divide the second trench along the second direction, and sidewalls of the second trench, arranged along the first direction, may expose corresponding sidewall spacer layers. The first trench and the second trench may be separated by the sidewall spacer layer.

The method for forming the semiconductor device may further include: after removing the core layer and the filling layer, etching the hard mask layer till exposing the surface of the layer to be etched using the first dividing layer, the second dividing layer and the sidewall spacer layer as the mask, thereby forming a first intermediate trench in the hard mask layer at a bottom of the first trench and forming a second intermediate trench in the hard mask layer at a bottom of the second trench; after forming the first intermediate trench and the second intermediate trench, etching the layer to be etched using the hard mask layer as the mask, thereby forming a first target trench in the layer to be etched at a bottom of the first intermediate trench and forming a second target trench in the layer to be etched at a bottom of the second intermediate trench; and forming a first conductive layer in the first target trench and forming a second conductive layer in the second target trench.

In one embodiment, after etching the second etch stop layer, the hard mask layer and the first etch stop layer at the bottom of the first trench, and etching the second etch stop layer, the hard mask layer and the first etch stop layer at the bottom of the second trench, and also before forming the first conductive layer and the second conductive layer, the first dividing layer, the second dividing layer, the sidewall spacer layer and the first etch stop layer may be removed. Next, the layer to be etched at the bottom of the first intermediate trench may be etched to form the first target trench in the layer to be etched, and the layer to be etched at the bottom of the second intermediate trench may be etched to form the second target trench in the layer to be etched. After forming the first target trench and the second target trench, the conductive film may be formed in the first target trench and the second target trench, and also on the hard mask layer. The conductive film may be planarized till exposing the top surface of the hard mask layer, thereby forming the first conductive layer in the first target trench and forming the second conductive layer in the second target trench, and then the hard mask layer and the first etch stop layer may be removed.

The first conductive layer and the second conductive layer may be made of a metal including copper or aluminum.

Accordingly, a semiconductor device formed by the above-mentioned method may be provided in one embodiment. The semiconductor device may include a base substrate layer, including first regions and second regions, where the first regions and the second regions are alternatingly arranged along a first direction, and a first region and a second region are adjacent to each other; a core layer on the first region of the base substrate layer; sidewall spacer layers on sidewalls of two sides of the core layer along the first direction; a filling layer on the second region between adjacent sidewall spacer layers which are arranged along the first direction; a first dividing trench in the filling layer on the second region to divide the filling layer along a second direction, where the second direction is perpendicular to the first direction, and sidewalls of the first dividing trench, arranged along the first direction, expose corresponding sidewall spacer layers; a second dividing trench in the core layer to divide the core layer along the second direction, where sidewalls of the second dividing trench, arranged along the first direction, expose corresponding sidewall spacer layers, and for adjacent first and second regions, a distance, along the second direction, between the second dividing trench on the first region and the first dividing trench on the second region is greater than zero; and a first dividing layer in the first dividing trench, and a second dividing layer in the second dividing trench.

From the above-mentioned embodiments, it can be seen that the technical solution provided by the present disclosure may achieve at least the following beneficial effects.

In the fabrication method of the semiconductor device provided by the technical solution of the present disclosure, the first dividing trench may divide the filling layer along the second direction, and after subsequently removing the filling layer and the core layer, the first dividing layer may be used to divide the first trench along the second direction; the second dividing trench may divide the core layer along the second direction, and after subsequently removing the filling layer and the core layer, the second dividing layer may be used to divide the second trench. The second dividing layer may be formed when forming the first dividing layer, that is, the first dividing layer and the second dividing layer may be formed in a same process, so the processing steps may be simplified.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A method for fabricating a semiconductor device, comprising:
   providing a base substrate layer including first regions and second regions, wherein the first regions and the second regions are alternatingly arranged along a first direction, and a first region and a second region are adjacent to each other;
   forming a core layer on the first region of the base substrate layer;
   forming sidewall spacer layers on sidewalls of two sides of the core layer along the first direction;
   forming a filling layer on the second region between adjacent sidewall spacer layers which are arranged along the first direction;
   forming a first dividing trench in the filling layer on the second region to divide the filling layer along a second direction, wherein the second direction is perpendicular to the first direction, and sidewalls of the first dividing trench, arranged along the first direction, expose corresponding sidewall spacer layers;
   after forming the filling layer, forming a second dividing trench in the core layer to divide the core layer along the second direction, wherein sidewalls of the second dividing trench, arranged along the first direction, expose corresponding sidewall spacer layers, and for adjacent first and second regions, a distance, along the second direction, between the second dividing trench on the first region and the first dividing trench on the second region is greater than zero;
   forming a first dividing layer in the first dividing trench, and forming a second dividing layer in the second dividing trench when forming the first dividing layer; and
   after forming the first dividing layer and the second dividing layer, removing the filling layer and the core layer.

2. The method according to claim 1, wherein:
   before forming the first dividing trench, the second dividing trench is formed; or before forming the second dividing trench, the first dividing trench is formed.

3. The method according to claim 1, further including:
   before forming the first dividing trench, forming a first blocking layer on the core layer, the sidewall spacer layer and the filling layer, wherein:
      the first blocking layer has a first blocking opening on one or more filling layers; and
      the first blocking opening also extends along the first direction on one or more of the sidewall spacer layers and one or more of the core layers to expose the one or more of the sidewall spacer layers and the one or more of the core layers;
   using the first blocking layer, the core layer and the sidewall spacer layer as a mask, etching and removing the filling layer at a bottom of the first blocking opening, thereby forming the first dividing trench in the filling layer; and
   after forming the first dividing trench and before forming the first dividing layer, removing the first blocking layer.

4. The method according to claim 1, further including:
   before forming the second dividing trench, forming a second blocking layer on the core layer, the sidewall spacer layer and the filling layer, wherein:
      the second blocking layer has a second blocking opening on one or more the core layers; and
      the second blocking opening also extends along the first direction on one or more of the sidewall spacer layers and one or more of the filling layers to expose the one or more of the sidewall spacer layers and the one or more of the filling layers;
   using the second blocking layer, the sidewall spacer layer and the filling layer as a mask, etching and removing the core layer at a bottom of the second blocking opening, thereby forming the second dividing trench in the core layer; and
   after forming the second dividing trench and before forming the second dividing layer, removing the second blocking layer.

5. The method according to claim 1, wherein forming the first dividing layer and the second dividing layer includes:
   forming a dividing film in the first dividing trench and the second dividing trench and on the core layer, the filling layer and the sidewall spacer layer; and planarizing the dividing film till exposing top surfaces of the core layer, the filling layer and the sidewall spacer layer, thereby forming the first dividing layer and the second dividing layer.

6. The method according to claim 1, wherein:
   materials of the filling layer, the core layer and the sidewall spacer layer are different.

7. The method according to claim 6, wherein:
the core layer is made of a material including amorphous silicon, silicon nitride or silicon oxide;
the sidewall spacer layer is made of a material including $SiO_2$, SiN, $TiO_2$, TiN, AlN, $Al_2O_3$, or a combination thereof; and
the filling layer is made of a material including $SiO_2$, SiN, $TiO_2$, TiN, AlN, $Al_2O_3$, or a combination thereof.

8. The method according to claim 1, wherein:
materials of the first dividing layer, the second dividing layer and the sidewall spacer layer are same.

9. The method according to claim 1, wherein:
materials of the first dividing layer and the second dividing layer are same; and
materials of the first dividing layer and the sidewall spacer layer are different.

10. The method according to claim 1, wherein:
a size of the first dividing layer along the second direction is about 20 nm to about 60 nm, and a size of the second dividing layer along the second direction is about 20 nm to about 60 nm.

11. The method according to claim 1, wherein:
a thickness of the sidewall spacer layer is about 10 nm to about 20 nm.

12. The method according to claim 1, wherein:
after forming the first dividing layer and the second dividing layer, the filling layer is removed to form a first trench on the second region of the base substrate layer, and the core layer is removed to form a second trench on the first region of the base substrate layer;
the first dividing layer divides the first trench along the second direction, and sidewalls of the first trench, arranged along the first direction, expose corresponding sidewall spacer layers;
the second dividing layer divides the second trench along the second direction, and sidewalls of the second trench, arranged along the first direction, expose corresponding sidewall spacer layers; and
the first trench and the second trench are separated by the sidewall spacer layer.

13. The method according to claim 12, wherein:
the base substrate layer includes a layer to be etched and a hard mask layer on the layer to be etched; and
the method further includes:
after removing the core layer and the filling layer, etching the hard mask layer till exposing a surface of the layer to be etched using the first dividing layer, the second dividing layer and the sidewall spacer layer as a mask, thereby forming a first intermediate trench in the hard mask layer at a bottom of the first trench and forming a second intermediate trench in the hard mask layer at a bottom of the second trench; and
after forming the first intermediate trench and the second intermediate trench, etching the layer to be etched using the hard mask layer as a mask, thereby forming a first target trench in the layer to be etched at a bottom of the first intermediate trench and forming a second target trench in the layer to be etched at a bottom of the second intermediate trench.

14. A semiconductor device, comprising:
a base substrate layer, including first regions and second regions, wherein the first regions and the second regions are alternatingly arranged along a first direction, and a first region and a second region are adjacent to each other;
a core layer on the first region of the base substrate layer;
sidewall spacer layers on sidewalls of two sides of the core layer along the first direction;
a filling layer on the second region between adjacent sidewall spacer layers which are arranged along the first direction;
a first dividing trench in the filling layer on the second region to divide the filling layer along a second direction, wherein the second direction is perpendicular to the first direction, and sidewalls of the first dividing trench, arranged along the first direction, expose corresponding sidewall spacer layers;
a second dividing trench in the core layer to divide the core layer along the second direction, wherein sidewalls of the second dividing trench, arranged along the first direction, expose corresponding sidewall spacer layers, and for adjacent first and second regions, a distance, along the second direction, between the second dividing trench on the first region and the first dividing trench on the second region is greater than zero; and
a first dividing layer in the first dividing trench, and a second dividing layer in the second dividing trench.

* * * * *